United States Patent
Park et al.

(10) Patent No.: US 12,308,084 B1
(45) Date of Patent: May 20, 2025

(54) INTERACTIVE DRAM SIGNAL ANALYZER AND METHOD OF ANALYZING AND CALIBRATING DRAM SIGNAL USING THE SAME

(71) Applicant: COSIGNON, Hanam-si (KR)

(72) Inventors: Sung Ho Park, Incheon (KR); Jang Ho Park, Hanam-si (KR); Dong Kyeong Kang, Pyeongtaek-si (KR)

(73) Assignee: COSIGNON, Hanam-si (KR)

( * ) Notice: Subject to any disclaimer, the term of this patent is extended or adjusted under 35 U.S.C. 154(b) by 0 days.

(21) Appl. No.: 18/641,983

(22) Filed: Apr. 22, 2024

(30) Foreign Application Priority Data

Nov. 10, 2023 (KR) .......................... 10-2023-0155304

(51) Int. Cl.
*G11C 29/12* (2006.01)
*G01R 31/317* (2006.01)

(52) U.S. Cl.
CPC .. *G11C 29/12005* (2013.01); *G01R 31/31708* (2013.01)

(58) Field of Classification Search
CPC ..................... G11C 29/12005; G01R 31/31708
USPC .......................................................... 714/721
See application file for complete search history.

(56) References Cited

U.S. PATENT DOCUMENTS

| | | | | |
|---|---|---|---|---|
| 11,674,978 B2 * | 6/2023 | Sterzbach | ................. | G06T 7/70 324/750.23 |
| 2010/0017668 A1 | 1/2010 | Pichamuthu et al. | | |
| 2016/0047859 A1 | 2/2016 | Deutsch et al. | | |
| 2016/0305996 A1 * | 10/2016 | Martens | ................. | G01R 27/02 |
| 2018/0219636 A1 * | 8/2018 | Gale | ................. | H04B 17/0085 |
| 2020/0151056 A1 | 5/2020 | Chen et al. | | |
| 2020/0309847 A1 * | 10/2020 | Lloyd | ................. | G01R 31/2837 |
| 2023/0194599 A1 * | 6/2023 | Gilabert | ................. | G06T 7/001 324/762.02 |

FOREIGN PATENT DOCUMENTS

| | | |
|---|---|---|
| KR | 100783647 B1 | 12/2007 |
| KR | 100864633 B1 | 10/2008 |
| KR | 1020100008703 A | 1/2010 |
| KR | 100959628 B1 | 5/2010 |
| KR | 1020140023027 A | 2/2014 |
| KR | 1020200010396 A | 1/2020 |
| KR | 1020220050317 A | 4/2022 |
| KR | 1020230076504 A | 5/2023 |

OTHER PUBLICATIONS

Office Action of Korean Patent Application No. 10-2023-0155304 dated Nov. 27, 2023.

* cited by examiner

*Primary Examiner* — James C Kerveros
(74) *Attorney, Agent, or Firm* — Dinsmore & Shohl LLP; Yongsok Choi, Esq.

(57) ABSTRACT

There may be provided an interactive DRAM signal analyzer, including a signal input/output unit configured to receive a command signal and data that are transmitted by a system on chip (SoC) including at least one processor through a memory subsystem, a signal analysis processing unit configured to generate a calibration command based on the analysis of the command signal and data that have been received memory subsystem, and a DRAM model configured to operate like DRAM based on the command signal and data received from the signal analysis processing unit and to output a command signal and data.

7 Claims, 3 Drawing Sheets

INTERACTIVE DRAM SIGNAL ANALYZER AND METHOD OF ANALYZING AND CALIBRATING DRAM SIGNAL USING THE SAME

CROSS-REFERENCE TO RELATED APPLICATION

This application is based on and claims priority under 35 U.S.C. § 119 to Korean patent application number 10-2023-0155304, filed on Nov. 10, 2023, in the Korean Intellectual Property Office, the disclosure of which is incorporated by reference herein in its entirety.

BACKGROUND

1. Technical Field

The present disclosure relates to an interactive DRAM signal analyzer capable of analyzing and calibrating a dynamic random access memory (DRAM) signal and a method of analyzing and calibrating a DRAM signal using the same. More specifically, the present disclosure relates to a DRAM signal analyzer capable of accessing and analyzing a command signal or data related to DRAM through an interaction with a transmission stage, such as a system on chip (SoC), at the shortest distance and a method of analyzing and calibrating a DRAM signal using the same.

2. Related Art

An oscilloscope, such as conventional signal measurement equipment, has a problem in that the integrity of a signal and a short delay time cannot be guaranteed due to a physical distance between the measurement equipment and a printed circuit board (PCB) and a difference between logical and physical elements between signals to be measured, upon measurement of an input and an output (I/O) disposed in the PCB for the debugging of the processing of signals and data between a transmission stage, such as an SoC, and a reception stage.

The oscilloscope, that is, the existing signal measurement equipment, is equipment that has been optimized for the monitoring of a signal and a voltage level only, and does not assist the integrity of a signal and does not have a phase calibration function between signals. Accordingly, the oscilloscope has a temporal limit and a technical difficulty in that from the standpoint of a user, the user has to monitor a measured signal and to repeat a circuit and digital design again in order to support the integrity of a signal and the phase calibration function.

Recently, there is a difficulty in a technology for measuring and calibrating a signal and data in a data transmission process between a deep learning-applied application and memory while requiring a calculation-intensive application of a deep application technology and a high memory frequency. From the standpoint of a user, a measurement equipment technology, such as the existing oscilloscope, requires a lot of time and lots of technologies in order to solve data and signal processing problems that occur in a transmission process.

As ultra-high frequency memory such as LPDDR5X and LPDDR6, emerges, in the future, signal equipment, such as the existing oscilloscope, also need to sufficiently support a high bandwidth. In order to prevent a bottleneck phenomenon upon signal measurement, proof equipment capable of guaranteeing a frequency bandwidth that is supported by an oscilloscope used is also required. In terms of the price, pieces of such advanced equipment have a problem in that they are dozens of times more expensive than the existing costs in purchasing the advanced equipment.

Accordingly, there is a need for an interactive DRAM signal analyzer having a calibration function between signals for analyzing a high frequency signal between a transmission stage, such as an SoC, and a reception stage, such as DRAM, and assisting the integrity of a signal through a method different from a conventional method, and a method of analyzing and calibrating a DRAM signal using the same.

SUMMARY

Various embodiments are directed to providing an interactive DRAM signal analyzer, which can measure a signal at the shortest distance in a PCB by providing the same ball map structure as that of DRAM, prevent a signal distortion phenomenon and guarantee the integrity of a signal upon signal measurement, and improve the quality of a measured signal without a need for an additional device, such as a probe device, by directly performing signal measurement within a device.

Furthermore, various embodiments are directed to providing an interactive DRAM signal analyzer, which can improve signal accuracy through the analysis of a phase difference between signals in a reception stage, such as a DRAM signal analyzer, through an interaction between a transmission stage, such as an SoC, and the reception stage, improve signal quality through the analysis of the voltage level of a signal in the reception stage, improve data accuracy through the analysis of a protocol between signals in the reception stage, and increase memory use efficiency through a customized response in the transmission stage based on the analysis of a phase difference between signals, the voltage level of the signal, and a protocol between the signals, which are received from the reception stage.

Furthermore, various embodiments are directed to providing an interactive DRAM signal analyzer in which an optimal DRAM operation environment can be set by enabling debugging and a function for verifying a normal operation before DRAM is integrated on a PCB.

Objects of the present disclosure are not limited to the aforementioned contents, and the other technical objects not described above may be evidently understood by those skilled in the art from the following description.

In an embodiment of the present disclosure, an interactive DRAM signal analyzer may include a signal input/output unit configured to receive a command signal and data that are transmitted by a system on chip (SoC) including at least one processor through a memory subsystem, a signal analysis processing unit configured to generate a calibration command based on the analysis of the command signal and data that have been received from the memory subsystem, and a DRAM model configured to operate like DRAM based on the command signal and data received from the signal analysis processing unit and to output a command signal and data.

In this case, the signal input/output unit may be packaged to have a ball map identical with a ball map of the DRAM.

Furthermore, the signal analysis processing unit may be configured to transmit, to the DRAM model, a first command signal and data received from the memory subsystem, receive a non-calibration command signal and data that are fed back by the DRAM model, generate a first calibration command based on the analysis of the non-calibration command signal and data, and transmit the first calibration command to the memory subsystem, and transmit, to the DRAM model, a second command signal and data that have been calibrated based on the first calibration command from the memory subsystem.

Furthermore, the first calibration command may be related to the calibration of at least one of a phase difference between signals, the voltage level of the signal, and a memory protocol between the signals.

Furthermore, the signal analysis processing unit may be configured to receive a calibrated command signal and data from the DRAM model and to determine whether memory operates normally based on the analysis of the calibrated command signal and data.

Furthermore, when determining that the memory operates normally based on the analysis of the calibrated command signal and data, the signal analysis processing unit may be configured to transmit a normal operation signal to the SoC and a user terminal.

Furthermore, when determining that the memory does not operate normally based on the analysis of the calibrated command signal and data, the signal analysis processing unit may be configured to generate a second calibration command based on the analysis of the calibrated command signal and data and to transmit the second calibration command to the memory subsystem.

Furthermore, the analysis of the non-calibration command signal and data may include the analysis of a phase difference between the command signals or the data, the analysis of a skew between the data on the basis of the command signal, a determination of whether a protocol between the command signals or the data complies with a standard memory protocol, and the analysis of the voltage level of the signal.

Furthermore, the memory subsystem may include a memory controller. The memory subsystem may be configured to receive the first calibration command by using the memory controller and to calibrate a protocol between the command signals or the data.

Furthermore, the memory subsystem may include a physical layer. The memory subsystem may be configured to adjust a skew between the data and calibrate the voltage level by using a training algorithm through the physical layer.

An embodiment of the present disclosure may provide the DRAM signal analyzer capable of accessing and analyzing a command signal or data related to DRAM at the shortest distance through an interaction in a transmission stage, such as an SoC, and a reception stage, such as a DRAM analyzer, and the method of analyzing and calibrating a DRAM signal using the same.

Furthermore, an embodiment of the present disclosure may provide the DRAM signal analyzer capable of stabilizing a memory operation by providing the analysis of a precise signal, power, or protocol and a debugging and verification environment in a situation in which the verification of a memory operation is difficult due to the emergence of memory having an ultra-high band frequency.

Furthermore, an embodiment of the present disclosure may provide a device capable of monitoring waveform attributes, such as the voltage level, time interval, and integrity of a signal, in order to improve a function of a DRAM circuit and having a phase calibration function between signals for assisting the integrity of a through an interaction between a transmission stage (e.g., an SoC) and a reception stage (e.g., a DRAM analyzer).

Effects of the present disclosure are not limited to the aforementioned effects, and the other technical effects not described above may be evidently understood by those skilled in the art from the following description.

DETAILED DESCRIPTION

Hereinafter, embodiments of the present disclosure are described in detail with reference to the accompanying drawings so that a person having ordinary knowledge in the art to which the present disclosure pertains can easily practice the embodiments. However, the present disclosure may be implemented in other various forms, and is not limited to the embodiments described herein.

Terms used in this specification are used to merely describe a specific embodiment, and are not intended to limit the present disclosure. An expression of the singular number includes an expression of the plural number unless clearly defined otherwise in the context.

"Comprise" or "comprising" used in this specification do not exclude the existence or addition of one or more other components, steps, operations and/or devices in addition to the described components, steps, operations and/or devices.

Furthermore, in describing the present disclosure, a detailed description of a related known technology will be omitted if it is deemed to make the subject matter of the present disclosure unnecessarily vague.

Hereinafter, embodiments of the present disclosure are described in detail with reference to the accompanying drawing.

A construction of the present disclosure and acting effects thereof will be clearly understood from the following detailed description.

Figure 1:
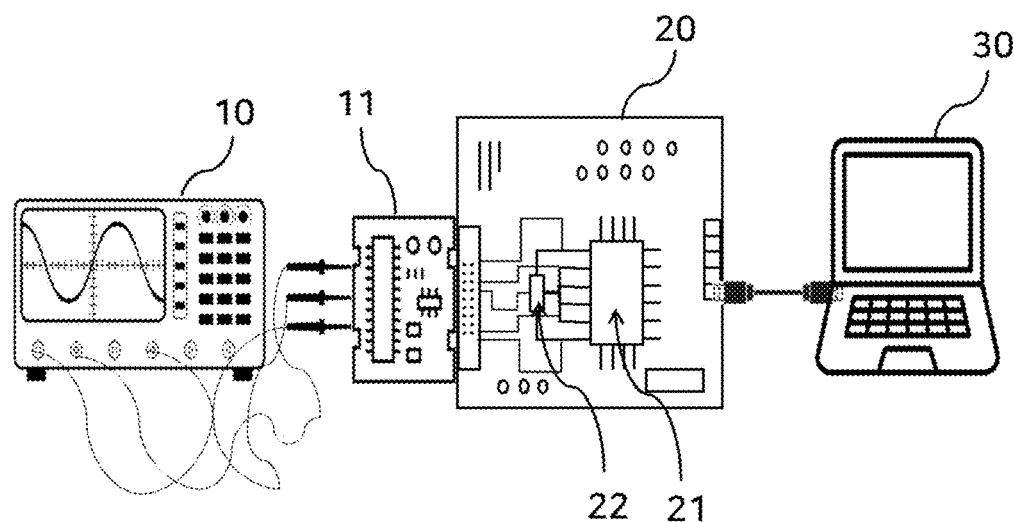
FIG. 1 is a concept view for describing a problem with a method of analyzing a DRAM-related signal by using an oscilloscope, that is, a conventional signal measurement apparatus.

FIG. 1 is a concept view for describing a problem with a method of analyzing a DRAM-related signal by using an oscilloscope, that is, a conventional signal measurement apparatus.

Referring to FIG. 1, an oscilloscope 10, that is, the existing signal measurement equipment, has problems in that it requires separate probe equipment for the analysis of signal and data processing between a transmission stage, such as an SoC, and a reception stage, such as DRAM that is disposed at a location at which memory 22 is integrated, and it cannot guarantee the integrity of a signal due to a delay time upon signal analysis because of a difference between a physical distance and logical elements between the measurement equipment and a printed circuit board (PCB) 20. Furthermore, the oscilloscope 10 requires a subboard 11 as separate interface means for the measurement of a signal because the measurement equipment, such as the oscilloscope 10, cannot be directly connected to a ball map of the memory from the transmission stage to the reception stage for the debugging of a memory operation after the PCB 20 is fabricated.

In this case, the transmission of a test vector or data to be input to the SoC 21 is performed through a user terminal 30. In general, the input data and the test vector are transmitted to the SoC 21 through software or an application of the user terminal 30. A data flow and results in the transmission process may be checked through the oscilloscope 10.

In this case, from the standpoint of a user, in order for the user monitor a measured signal in the oscilloscope 10 and to support the integrity of the signal and a phase calibration function, a lot of time is taken and a technical difficulty is also present because the user has to continuously repeat a circuit and digital design.

As described above, if the oscilloscope 10 that is the conventional signal measurement equipment is used, upon measurement of an input and an output (I/O) disposed in the printed circuit board (PCB) 20 for the debugging of the signal and data processing between the transmission stage and the reception stage, there is a problem in that the integrity of a signal and a delay time cannot be guaranteed due to a physical distance between the measurement equipment and the PCB and a difference between logical and physical elements between signals to be measured.

Figure 2:
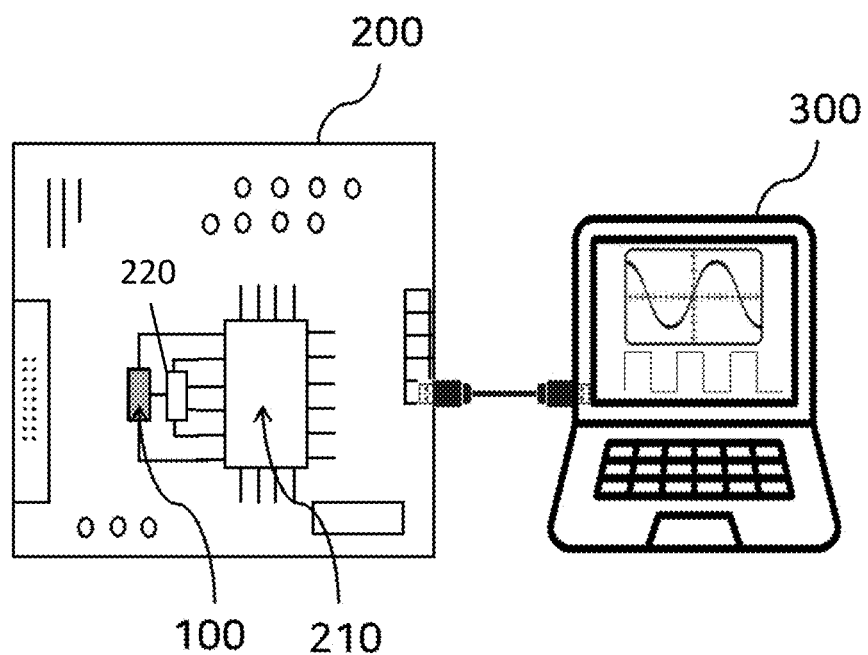
FIG. 2 is a concept view for describing a construction of a DRAM signal analyzer configured to analyze and calibrate a DRAM-related signal according to an embodiment of the present disclosure.

FIG. 2 is a concept view for describing a construction of a DRAM signal analyzer configured to analyze and calibrate a DRAM-related signal according to an embodiment of the present disclosure.

Referring to FIG. 2, a DRAM signal analyzer 100 has the same physical specifications as DRAM because it is packaged to have the same ball map as the DRAM, so that the DRAM signal analyzer 100 may be mounted on a PCB 200 along with the DRAM. Accordingly, the DRAM signal analyzer 100 can prevent a signal distortion phenomenon and guarantee the integrity of a signal because the DRAM signal analyzer can measure the signal at the shortest distance in the PCB 200, and does not require an additional device, such as conventional probe equipment, and can improve the quality of the signal because the DRAM signal analyzer can directly measure the signal within a device. For example, the DRAM signal analyzer 100 has the same ball map as the DRAM, and may be disposed at a location at which the DRAM is integrated on the PCB 200 and connected to an SoC 210 so that signals can be transmitted and received as illustrated in FIG. 2. In this case, the SoC 210 is an integrated circuit (IC) that integrates computer components with a single chip. Common computer components of the SoC include a central processing unit (CPU), memory, an input/output port, and auxiliary storage. The SoC 210 is a subject, such as a master or a host that uses the DRAM and drives specific applications. In this case, the SoC may perform various signal processing functions, and may include a special processor or a co-processor, such as a graphic processing unit (GPU). Furthermore, one SoC 210 has been illustrated in FIG. 1, for convenience sake, but a plurality of SoCs 210 and a plurality of DRAM signal analyzers 100 which may be connected to the SoCs may be used.

A user may configure the DRAM signal analyzer 100 so that memory use efficiency is improved based on results that are customized depending on the analysis of a DRAM signal, a phase difference between signals, the voltage level of the signal, or a protocol between the signals based on an analysis function through an interaction between a transmission stage, such as the SoC 210, and a reception stage, such as the DRAM signal analyzer 100, through a user terminal 300 by using a circuit technology capable of analyzing a transmission and reception signal characteristic. A more detailed construction of the DRAM signal analyzer 100 will be described hereinafter.

Figure 3:
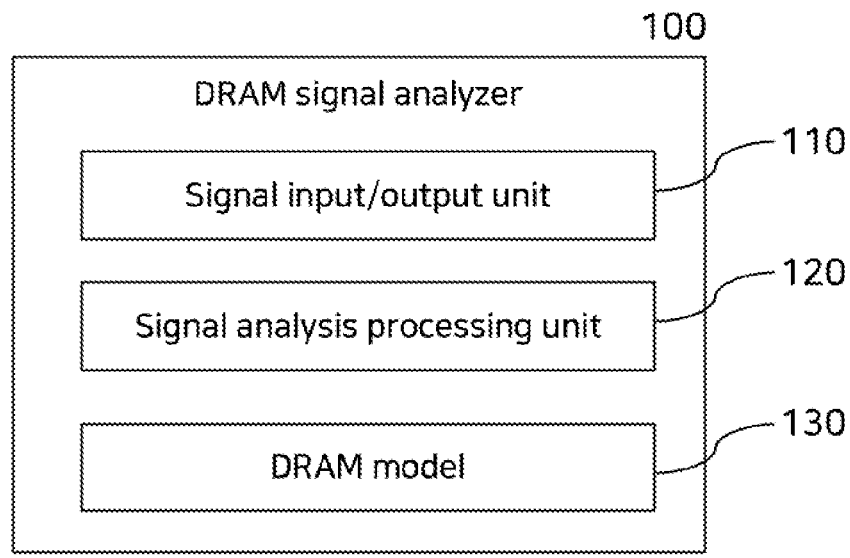
FIG. 3 is a block diagram for describing a construction of the DRAM signal analyzer according to an embodiment of the present disclosure.

FIG. 3 is a block diagram for describing a construction of the DRAM signal analyzer according to an embodiment of the present disclosure.

The DRAM signal analyzer 100 may include a signal input/output unit 110, a signal analysis processing unit 120, and a DRAM model 130.

First, the signal input/output unit 110 may be configured to receive a command signal and data that are transmitted by the SoC 210 including at least one processor through a memory subsystem and to transmit and receive processed data between the DRAM signal analyzer 100 and the memory subsystem. In this case, the signal input/output unit 110 is packaged to have the same ball map as DRAM and thus has the same hardware specifications as the DRAM. Accordingly, the signal input/output unit 110 may be configured to directly measure a signal on the PCB 200 because the DRAM signal analyzer 100 is disposed on the PCB 200 in the same way as the DRAM.

The signal analysis processing unit 120 may be configured to generate a calibration command based on the analysis of a command signal and data that have been received from the memory subsystem including a memory controller. In this case, the command signal is a signal to request data write or data read at a specific address of memory, for example. The data means data that are transmitted and received when a specific application is executed from the standpoint of the SoC 210, and may be stored or invoked, if necessary. For example, if an AI application is executed, data that are necessary for learning or data on which calculation processing has been completed may be used. Furthermore, such a command signal may be transmitted to the memory subsystem capable of processing a protocol between signals because the command signal needs to be transmitted in a protocol format suitable for corresponding memory.

In this case, the memory subsystem means a driving-assistant system of a memory system, which receives a memory access request from a subject that is physically connected to another chip and that reads data from and writes data into the memory, for example, the SoC 210, stably transmits a memory driving command and data to the memory or the DRAM signal analyzer 100, and consists of a memory controller, a physical layer (PHY), and an input/output (IO) for reading, writing, and retaining memory data.

Furthermore, the DRAM model 130 may be configured to operate like the DRAM based on a command signal and data that are received from the signal analysis processing unit 120 and to output a command signal and data. The DRAM model 130 has been modeled in a software way identically with a role that is performed by the DRAM. The DRAM model is not actual DRAM, but performs a role capable of interfacing with virtual DRAM. The DRAM model 130 is configured to previously supplement problems, which may occur due to debugging, a protocol or timing, or a skew difference, through communication between pieces of DRAM by using the role. In this case, the DRAM may include double data rate synchronous dynamic random access memory (DDR SDRAM), low power double data rate (LPDDR) SDRAM, graphics double data rate (GDDR)

SDRAM, and Rambus DRAM (RDRAM), for example. Furthermore, the DRAM may be implemented in various forms, such as static DRAM (SDRAM), high bandwidth memory (HBM), or processor-in-memory (PIM), but the present disclosure is not limited thereto.

In this case, the signal analysis processing unit 120 may be configured to transmit, to the DRAM model 130, a first command signal and data that have been received from the memory subsystem, to receive non-calibration (not-calibrated) command signal and data that have been fed back by the DRAM model 130, to generate a first calibration command based on the analysis of the non-calibration command signal and data, to transmit the first calibration command to the memory subsystem, and to transmit a second command signal and data that have been calibrated based on the first calibration command from the memory subsystem to the DRAM model 130 again. In this case, the analysis of the non-calibration command signal and data may include the analysis of a phase difference between the command signals or the data, the analysis of a skew between the data on the basis of the command signal, and a determination of whether a protocol between the signals complies with a standard memory protocol, and the analysis of the voltage level of the signal. Furthermore, the first calibration command signal may be related to the calibration of at least one of a phase difference between signals, the voltage level of the signal, and a memory protocol between the signals.

Furthermore, the signal analysis processing unit 120 may be configured to receive a calibrated command signal and data from the DRAM model 130 and to determine whether the memory operates normally based on the analysis of the calibrated command signal and data.

In this case, when the signal analysis processing unit 120 determines that the memory operates normally based on the analysis of the calibrated command signal and data, the signal analysis processing unit 120 may be configured to perform an operation requested by the SoC 210 and to transmit a normal operation signal to the SoC 210 and the user terminal 300.

Furthermore, when the signal analysis processing unit 120 determines that the memory does not operate normally based on the analysis of the calibrated command signal and data, the signal analysis processing unit 120 may be configured to generate a second calibration command based on the analysis of the calibrated command signal and data and to transmit the second calibration command to the memory subsystem, to transmit the calibrated command signal and data to the DRAM model 130 once more through such an operation, and to repeat the signal analysis and the calibration task by receiving and analyzing a calibrated command signal and data.

Furthermore, the memory subsystem includes the memory controller. The memory subsystem may be configured to receive a calibration command by using the memory controller and to calibrate a protocol between command signals or data. Furthermore, the memory subsystem includes the physical layer. The memory subsystem may be configured to adjust a skew between data and to calibrate the voltage level of the signal by using a training algorithm through the physical layer.

Figure 4:
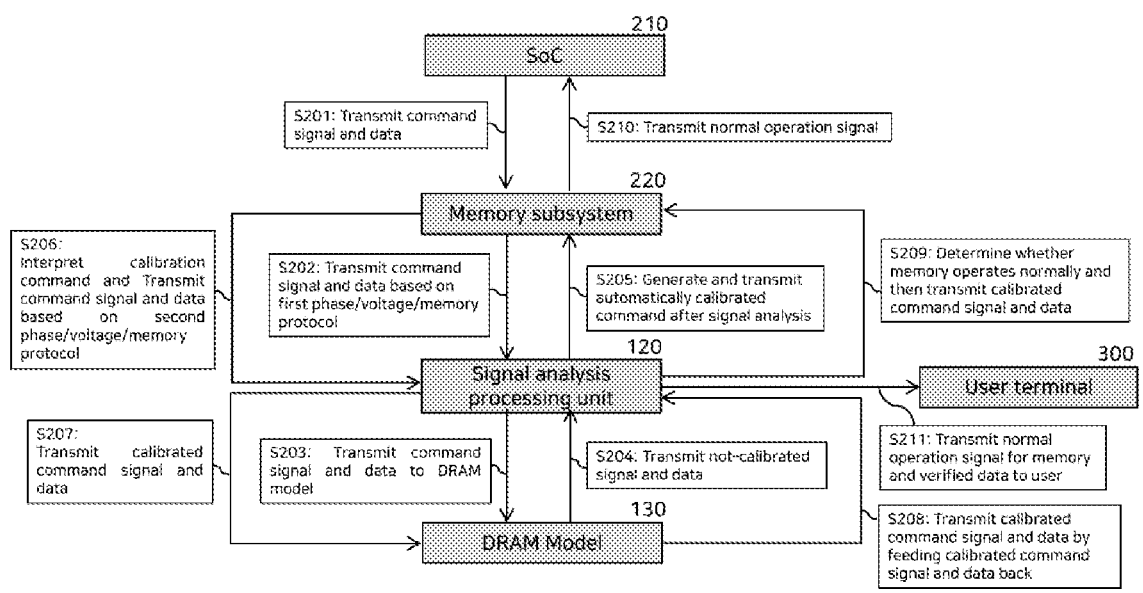
FIG. 4 is a flowchart for describing a method of analyzing and calibrating a DRAM-related signal through an interaction between an SoC and the DRAM signal analyzer according to an embodiment of the present disclosure.

FIG. 4 is a flowchart for describing a method of analyzing and calibrating a DRAM-related signal through an interaction between the SoC and the DRAM signal analyzer according to an embodiment of the present disclosure.

FIG. 4 illustrates a process of transmitting and receiving, by the SoC 210, that is, a transmission stage, and the DRAM signal analyzer 100, that is, a reception stage including the signal analysis processing unit 120 and the DRAM model 130, signals through the memory subsystem 220.

First, the SoC 210 may transmit a DRAM-related command signal and data to the memory subsystem 220 (S201).

The memory subsystem 220 may generate a command signal and data based on a first phase, voltage, and memory protocol, and may transmit the command signal and data to the signal analysis processing unit 120 through the signal input/output unit 110 of the DRAM signal analyzer 100 (S202). In this case, the memory subsystem 220 transmits the command signal and data through a training algorithm. However, the command signal and data based on the first phase, voltage, and memory protocol have not been calibrated based on results that have been output through the DRAM model 130, and thus mean a raw command signal and data that have not been calibrated.

The signal analysis processing unit 120 transmits the command signal and data to the DRAM model 130 (S203). The DRAM model 130 is configured to output the received command signal and data by feeding the received command signal and data back without any change. In this case, the DRAM model 130 may output and transmit a not-calibrated command signal and data to the signal analysis processing unit 120 based on the first phase, voltage, and memory protocol (S204). In this case, the command signal and data that have been output by the DRAM model 130 mean an output after a response through the memory model.

The signal analysis processing unit 120 may analyze the not-calibrated command signal and data received from the DRAM model 130, may analyze a phase difference between signals, a difference between the voltage levels of signals, and a signal the protocol of which is not suitable for a standard memory protocol, for example, and may transmit, to the memory subsystem 220, a calibration command that has been autonomously generated based on the results of the analysis of the signal (S205). As described above, the signal analysis processing unit 120 may generate the calibration command for signal calibrations, such as a phase difference between signals, the voltage level and impedance of the signal, and a memory protocol between the signals, in order to improve the accuracy and quality of the signal, based on the analysis of a phase difference between the command signals or the data, the analysis of a skew between the data on the basis of the command signal, the analysis of the voltage level of the signal, the analysis of a protocol between interface signals, or the analysis of the impedance of the signal for power integrity in the reception stage.

The memory subsystem 220 may transmit the command signal and data to the signal analysis processing unit 120 again based on a second phase, voltage, and memory protocol that have been generated by interpreting the calibration command received from the signal analysis processing unit 120 and applying the training algorithm (S206).

The signal analysis processing unit 120 may transmit, to the DRAM model 130 again, a command signal and data that have been calibrated based on the calibration command as described above (S207).

The DRAM model 130 is configured to output the command signal and data that have been received through the calibration by feeding the command signal and data back without any change. In this case, differently from step S204, the DRAM model 130 may output and transmit the calibrated command signal and data to the signal analysis processing unit 120 (S208).

The signal analysis processing unit 120 may determine whether the memory operates normally based on the calibrated command signal and data that have been fed back by the DRAM model 130, and may transmit the calibrated command signal and data to the memory subsystem 220 (S209).

In this case, when determining that the memory operates normally based on the analysis of the calibrated command signal and data, the signal analysis processing unit 120 is configured to transmit a normal operation signal that has been obtained by completing the processing of the command, which has been requested by the SoC 210, normally, to the SoC 210 and the user terminal 300 (S210 and S211). A user may check whether the memory operates normally through the user terminal 300, and may receive verified data.

In contrast, when determining that the memory does not operate normally based on the analysis of the calibrated command signal and data, the signal analysis processing unit 120 may generate a second calibration command again based on the analysis of the calibrated command signal and data, and may repeat steps S206 to S209 by transmitting the second calibration command to the memory subsystem 220.

In an embodiment of the present disclosure, a transmission stage (e.g., the SoC) may transmit a re-command and an optimization algorithm for signal calibration to a reception stage (e.g., the DRAM signal analyzer) based on the results of signal analysis and a calibration command, which have been received from the reception stage, through an interaction with the DRAM signal analyzer 100 and the SoC 210, so that the reception stage may operate according to a memory standard while complying with a memory protocol. Furthermore, the transmission stage may analyze a phase difference between signals received from the reception stage, and may transmit an optimal register set to the reception stage based on a training algorithm that autonomously analyzes and calibrates the phase difference between the signals so that the reception stage may adjust a phase difference between the signals. Furthermore, the transmission stage may analyze the voltage level of the signal received from the reception stage, and may transmit an optimal register set to the reception stage based on a training algorithm that autonomously analyzes and calibrates the voltage level of the signal so that the reception stage can adjust the voltage level.

Figure 5:
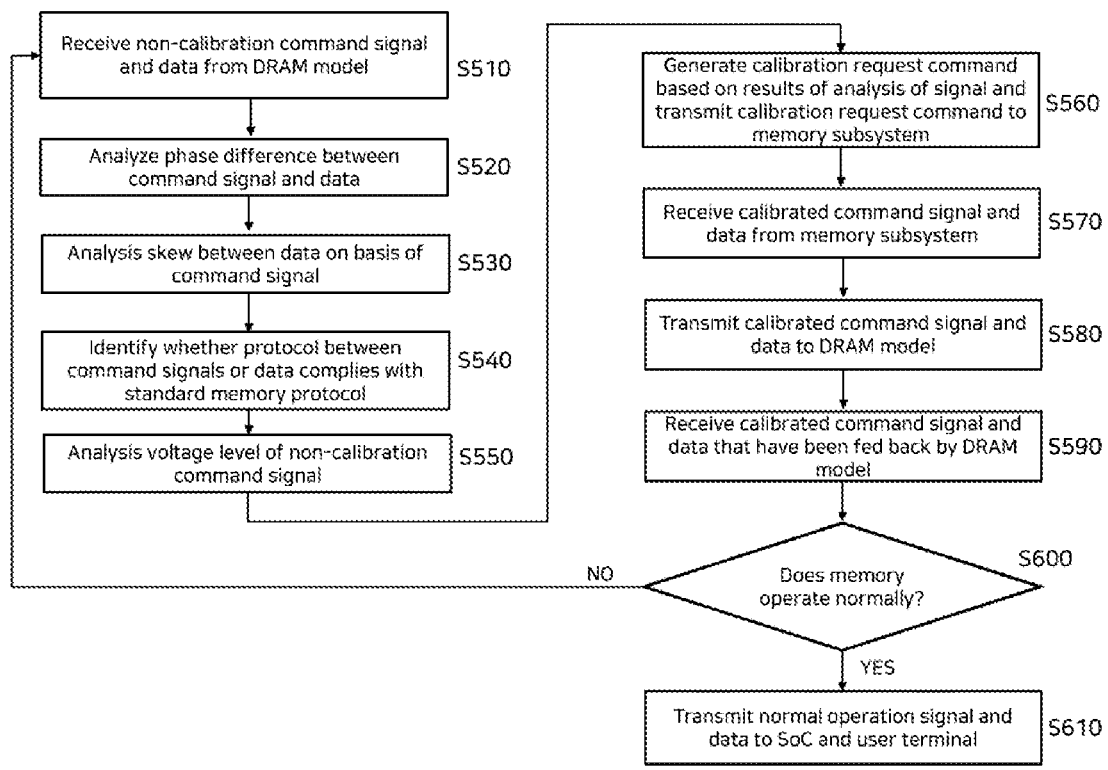
FIG. 5 is a flowchart for describing a method of analyzing and calibrating a DRAM-related signal in a signal analysis processing unit of the DRAM signal analyzer according to an embodiment of the present disclosure.

FIG. 5 is a flowchart for describing a method of analyzing and calibrating a DRAM-related signal in the signal analysis processing unit of the DRAM signal analyzer according to an embodiment of the present disclosure.

Referring to FIG. 5, the signal analysis processing unit 120 of the DRAM signal analyzer 100 may receive a non-calibration (not-calibrated) command signal and data from the DRAM model 130 that operates like DRAM (S510).

The signal analysis processing unit 120 may analyze a phase difference between the command signals or the data (S520), may analyze a skew between the data on the basis of the command signal (S530), may identify whether a protocol between signals complies with a standard memory protocol (S540), and may analyze the voltage level of the non-calibration command signal (S550).

The signal analysis processing unit 120 may generate a calibration request command that requests the calibration of the command signal and data based on the results of the analysis of the signal, and may transmit the calibration request command to the memory subsystem 220 (S560).

The signal analysis processing unit 120 may receive a calibrated command signal and data from the memory subsystem 220 (S570), and may transmit the calibrated command signal and data to the DRAM model 130 (S580).

The signal analysis processing unit 120 may receive the calibrated command signal and data that have been fed back by the DRAM model 130 (S590), and may determine whether memory operates normally (S600).

When determining that the memory operates normally based on the analysis of the calibrated command signal and data, the signal analysis processing unit 120 may be configured to transmit a normal operation signal that has been obtained by completing the processing of the command, which has been requested by the SoC 210, normally to the SoC 210 and the user terminal 300 (S610).

When determining g that the memory does not operate normally based on the analysis of the calibrated command signal and data, the signal analysis processing unit 120 may be configured to return back to step S510 and repeat the signal analysis and the calibration task in steps S510 to S600.

The embodiments disclosed in the specification of the present disclosure are merely examples, and the present disclosure is not limited to the embodiments. The scope of the present disclosure should be construed by the claims, and all technologies within an equivalent range thereof should also be construed as being included in the scope of the present disclosure.

What is claimed is:

1. A printed circuit board (PCB) comprising:
    a system on a chip (SOC) comprising at least one processor; and
    an interactive DRAM signal analyzer comprising:
        a signal input/output unit;
        a signal analysis processing unit configured to receive a command signal and data from the SOC through a memory subsystem and generate a calibration command based on an analysis of the command signal and data received from the SOC, wherein the command signal is a signal to request data write or data read at a specific address of DRAM; and
        a DRAM model configured to interface with virtual DRAM based on the command signal and data received from the signal analysis processing unit and to output a command signal and data,
    wherein the signal analysis processing unit is configured to:
    transfer, to the DRAM model, a first command signal and data received from the memory subsystem,
    receive a non-calibration command signal and data that are fed back by the DRAM model, generate a first calibration command based on an analysis of the non-calibration command signal and data, and transmit the first calibration command to the memory subsystem, and
    transfer, to the DRAM model, a second command signal and data that have been calibrated based on the first calibration command from the memory subsystem,
    wherein the first calibration command is related to a calibration of at least one of a phase difference between signals, a voltage level of the signal, and a memory protocol between the signals, and
    wherein a ball map of the interactive DRAM signal analyzer is the same as a ball map of an actual DRAM to be placed on the PCB.

2. The PCB of claim 1, wherein the signal analysis processing unit is configured to
    receive a calibrated command signal and data from the DRAM model, and
    determine whether memory operates normally based on an analysis of the calibrated command signal and data.

3. The PCB of claim 2, wherein when determining that the memory operates normally based on the analysis of the calibrated command signal and data, the signal analysis processing unit is configured to transmit a normal operation signal to the SoC and a user terminal.

4. The PCB of claim 2, wherein when determining that the memory does not operate normally based on the analysis of the calibrated command signal and data, the signal analysis processing unit is configured to generate a second calibration command based on the analysis of the calibrated command signal and data and to transmit the second calibration command to the memory subsystem.

5. The PCB of claim 1, wherein the analysis of the non-calibration command signal and data comprises an analysis of a phase difference between the command signals or the data, an analysis of a skew between the data on a basis of the command signal, a determination of whether a protocol between the signals complies with a standard memory protocol, and an analysis of a voltage level of the signal.

6. The PCB of claim 1, wherein:
the memory subsystem comprises a memory controller, and
the memory subsystem is configured to receive the first calibration command by using the memory controller and to calibrate a protocol between the command signals or the data.

7. The PCB of claim 1, wherein:
the memory subsystem comprises a physical layer, and
the memory subsystem is configured to adjust a skew between the data and calibrate the voltage level by using a training algorithm through the physical layer.

* * * * *